United States Patent
Barsun et al.

(10) Patent No.: US 7,280,371 B2
(45) Date of Patent: Oct. 9, 2007

(54) MULTISTAGE MOUNTING PRINTED CIRCUIT BOARD SYSTEM AND METHOD

(75) Inventors: Stephan Karl Barsun, Davis, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 348 days.

(21) Appl. No.: 10/758,982

(22) Filed: Jan. 16, 2004

(65) Prior Publication Data

US 2005/0157481 A1    Jul. 21, 2005

(51) Int. Cl.
*H05K 1/11* (2006.01)
*H05K 1/14* (2006.01)

(52) U.S. Cl. .................. 361/792; 361/788; 361/736

(58) Field of Classification Search ............... 361/760, 361/720, 736, 748, 792, 788; 174/150
See application file for complete search history.

(56) References Cited

U.S. PATENT DOCUMENTS

| | | | |
|---|---|---|---|
| 4,840,570 A * | 6/1989 | Mann et al. .................. 439/74 |
| 5,031,074 A * | 7/1991 | Ravid .......................... 361/683 |
| 6,137,684 A * | 10/2000 | Ayd et al. ..................... 361/727 |
| 6,511,139 B2 * | 1/2003 | Liu ........................... 312/223.2 |
| 6,625,035 B1 * | 9/2003 | Steinman et al. ............ 361/759 |
| 6,822,874 B1 * | 11/2004 | Marler ......................... 361/752 |
| 6,904,482 B2 * | 6/2005 | Rietze et al. ................ 710/107 |
| 6,950,311 B1 * | 9/2005 | DeCesare et al. ........... 361/727 |

\* cited by examiner

*Primary Examiner*—Tuan T. Dinh
*Assistant Examiner*—Hung S Bui

(57) ABSTRACT

A multi stage mounting printed circuit board system and method is presented. In one embodiment, a multi stage mounting printed circuit board system includes a first printed circuit board for mounting electrical components on. A first printed circuit board interface component is coupled to the first printed circuit board. The first printed circuit board interface component communicatively couples the first printed board to a second printed board via a second printed circuit board interface component. A plurality of printed circuit board extractors are coupled to the first printed circuit board. The plurality of printed circuit board extractors couple the first printed circuit board to card guides (e.g., a single pair of card guides in which the second printed circuit board is mounted).

15 Claims, 4 Drawing Sheets

300

```
┌─────────────────────────────────────────────────────────────┐
│                                                             │
│  Restricting movement of a plurality of printed circuit boards │
│         within a single pair of chassis rails.              │
│                         310                                 │
│                                                             │
└─────────────────────────────────────────────────────────────┘
                              │
                              ▼
┌─────────────────────────────────────────────────────────────┐
│                                                             │
│   Exerting forces associated with a mechanical advantage,   │
│  wherein the forces contribute to the insertion and extraction │
│  of each of the plurality of printed circuit boards separately in │
│            the single pair of chassis rails.                │
│                         320                                 │
│                                                             │
└─────────────────────────────────────────────────────────────┘
                              │
                              ▼
┌─────────────────────────────────────────────────────────────┐
│                                                             │
│    Locking each of the plurality of printed circuit boards in │
│      place individually in the single pair of chassis rails. │
│                         330                                 │
│                                                             │
└─────────────────────────────────────────────────────────────┘
```

FIG. 3

MULTISTAGE MOUNTING PRINTED CIRCUIT BOARD SYSTEM AND METHOD

FIELD OF THE INVENTION

The present invention relates to printed circuit board configuration. More particularly, the present invention relates to a multi stage printed circuit board mounting system and method.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these advantageous results are realized through the use of various functional electronic components included on printed circuit boards. While the printed circuit boards typically provide advantageous organization and configuration of the electronic components, there are often flexibility and/or extensibility limitations associated with printed circuit board configurations.

The importance of information processed and communicated by modern electronic systems is increasing and can result in significant economic impact if the processing and communication operations are not reliable. For example, an almost insatiable desire for increased communication bandwidth and information processing capacity has led to a tremendous demand for advanced capabilities. To obtain desired performance results from electronic components it is usually critical for the components to operate reliably. Without reliable operation an electronic component usually does not perform properly and results are suspect.

There are a number of things that can impact reliability. Actual in field conditions can have a significant impact on reliability and users typically expose electronic components to a wide variety of operating conditions. For example, a high temperature environmental condition also contributes to stressing the components in a detrimental manner and increases the likelihood of a failure. The number of "operations" electronic components perform (e.g., transistors turning on and off as data traffic passes through a communications component), the higher the likelihood of a failure typically because the operations usually electrically stress the components. As a component participates in greater operational activities and diverse environments, accurately maintaining components becomes more difficult.

Systems that include printed circuit boards are often large and complex systems and maintaining large systems is usually very complicated. Printed circuited boards are usually inserted in a card cage or chassis coupled to a back plane. In some implementations multiple "daughter" printed circuit boards can be coupled to a "mother board" that also operates as a back plane. The back plane is typically a passive "receptacle" for receiving multiple printed circuit boards and include busses for communicating information between the printed circuit boards. However, the number, the type and the configuration electronic components on printed circuit board coupled to a back plane can have a significant impact on maintenance.

Large printed circuit boards are often pose significant maintenance difficulties. Large circuit boards are bulky and usually difficult to handle and maneuver. In addition, maintenance of large printed circuit boards is usually very resource intensive. Electronic components usually have some probability of failure and the probability of any one of them failing typically increases as the number of components on a board increases. With increasingly sophisticated systems even one component failure can have significant detrimental impacts. Even with just one problem component a printed circuit board often has to be entirely replaced. Replacing a printed circuit board with a lot of components on it can be very costly.

Another traditional approach is to plug additional printed circuit boards into a back plane. However plugging additional printed circuit boards into a back plane occupies precious back plane space. Increasing the size of the back plane to accommodate additional boards consumes resources to build a larger back plane. In addition chassis with larger back planes are also typically larger, making the entire system bulkier, often less maneuverable and mobile. Larger backplanes also make cooling more difficult by tending to hinder airflow, thereby reducing reliability further by driving up operating temperatures. Larger chassis also usually occupy larger portions of precious floor space, such as in centralized processing facilities (e.g., a server farm).

SUMMARY OF THE INVENTION

A multi stage mounting printed circuit board system and method is presented. In one embodiment, a multi stage mounting printed circuit board system includes a first printed circuit board for mounting electrical components on. A first printed circuit board interface component is coupled to the first printed circuit board. The first printed circuit board interface component communicatively couples the first printed board to a second printed board via a second printed circuit board interface component. A plurality of printed circuit board extractors are coupled to the first printed circuit board. The plurality of printed circuit board extractors couple the first printed circuit board to card guides (e.g., a single pair of card guides in which the second printed circuit board is mounted).

BRIEF DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 3 is a flow chart of a multi stage printed circuit board mounting method in accordance with one embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood the present invention may be practiced without these specific details. In other instances, some readily understood methods, procedures, components, and circuits have not been described in detail as not to unnecessarily obscure aspects of the current invention.

The present invention facilitates flexible and modular configuration of printed circuit boards in a chassis. The modular configurations available with the present invention enable increased design flexibility and ease servicing operations. In one embodiment, present invention multi stage printed circuit board mounting systems and methods enable multiple printed circuit boards to be coupled to each other and mounted (e.g., inserted and extracted) in a single pair of chassis rails or card guides. In an alternate embodiment, multiple printed circuit boards are coupled to each other and mounted (e.g., inserted and extracted) and mounted in a plurality of card guides. The printed circuit boards can be inserted and extracted separately in a secure and convenient manner. The present invention also enables shorter electrical bus lengths between the two printed circuit boards coupled directly to each other as compared with two printed circuit boards coupled via a backplane. The following discussion begins with a description of the physical structure of some embodiments in accordance with the present invention. The physical structure discussion is followed with a description of some implementations in operation in accordance with the present invention.

Figure 1A:
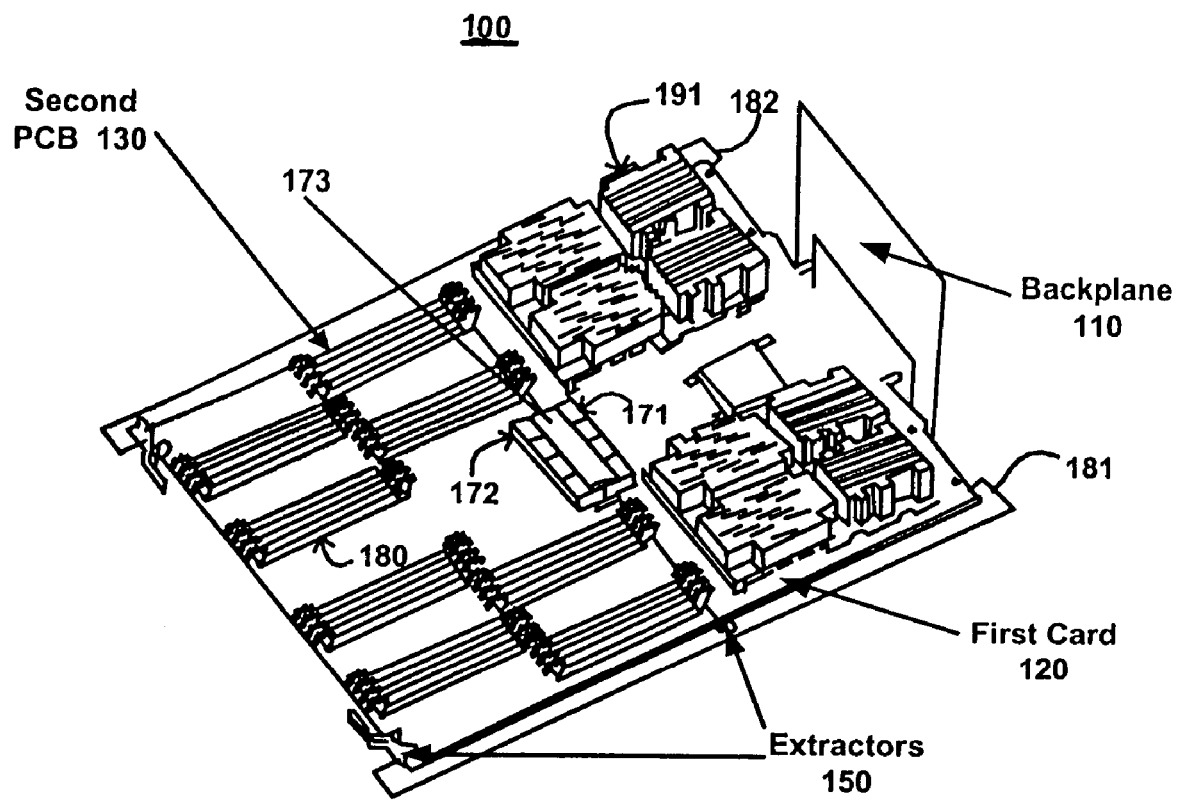
FIG. 1A is a top view diagram of a multi stage printed circuit board mounting system in accordance with one embodiment of the present invention.

FIG. 1A is a block diagram of multi stage printed circuit board mounting system 100 in accordance with one embodiment of the present invention. Multi stage printed circuit board mounting system 100 permits printed circuit boards to plug into one another in a cascaded sequential manner and one of the plurality of printed circuit boards plugs into the back plane of a chassis. The printed circuit boards can be sequentially added or removed from the card guides. In one exemplary implementation, a plurality of multi stage mounting printed circuit boards are mounted in the same pair of card guides. In one embodiment, multi stage printed circuit board mounting system 100 includes mechanical advantage mechanisms for assisting with insertion and/or removal of the printed circuit boards. The mechanical advantage mechanisms can also include features for securing the printed circuit boards in place.

A top view of multi stage printed circuit board mounting system 100 is shown in FIG. 1A. Multi stage printed circuit board mounting system 100 comprises a plurality of multi stage mounting printed circuit boards coupled together (e.g., in a single pair of card guides). For example, first multi stage mounting printed circuit board or card 120 and second multi stage mounting printed circuit board or card 130 are coupled together. Multi stage printed circuit board mounting system 100 also comprises a back plane for receiving one of the plurality of multi stage mounting printed circuit boards. For example, back plane 110 can receive first multi stage mounting printed circuit board or card 120. A card guide for guiding the plurality of multi stage mounting printed circuit boards is also included in multi stage printed circuit board mounting system 100. For example, multi stage printed circuit board mounting system 100 includes a pair of chassis rails or card guides 181 and 182.

With reference still to FIG. 1A, a present invention multi stage mounting printed circuit board includes components for facilitating coupling of printed circuit boards in a cascaded serial fashion. In one embodiment, a multi stage mounting printed circuit board includes an interface component for communicatively coupling a first multi stage mounting printed circuit board to a second multi stage mounting printed circuit board. For example, first multi stage mounting printed circuit board 120 includes an interface component 171 for communicatively coupling first multi stage mounting printed circuit board 120 to second multi stage mounting printed circuit board 130 via interface component 172. Interface component 171 and interface component 172 communicatively couple to each other along junction line 173. In one exemplary implementation, the interface component 171 includes a signal port connector for communicating signals from first multi stage mounting printed circuit board 120 to the second multi stage mounting printed circuit board 130.

Figure 2:
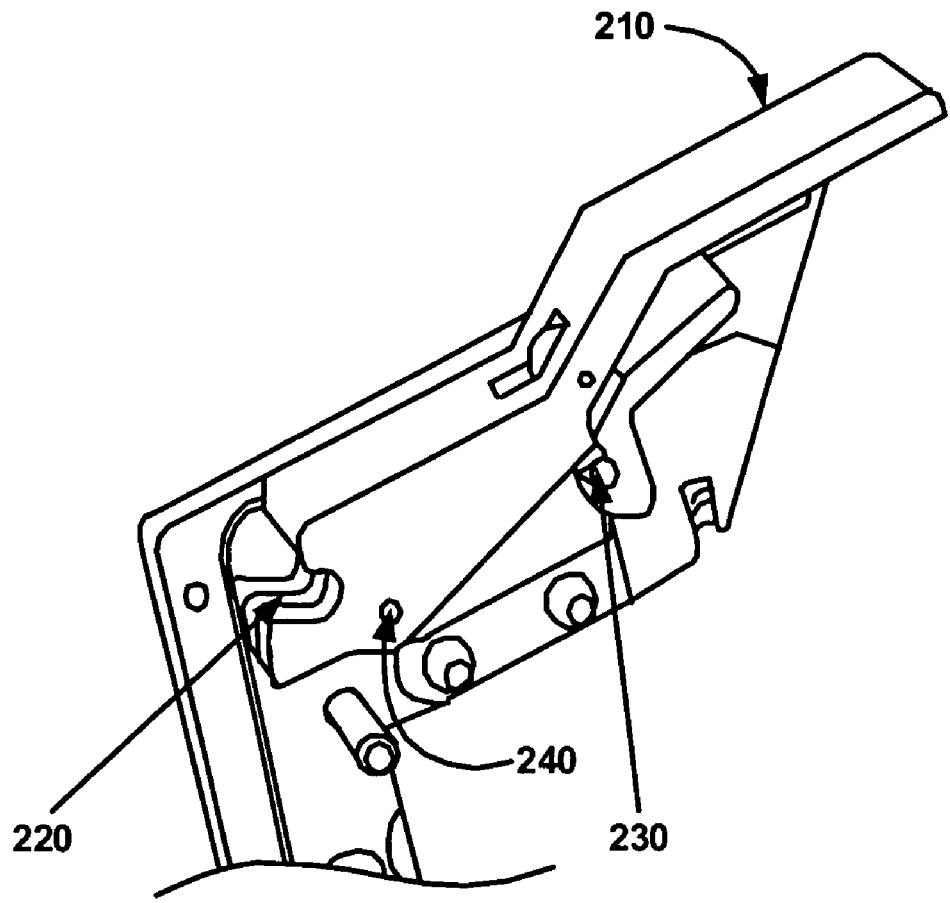
FIG. 2 is an illustration of a printed circuit board extractor in accordance with one embodiment the present invention.

FIG. 2 is an illustration of printed circuit board extractor 200 in accordance with one embodiment the present invention. In one embodiment of the present invention, a printed circuit board extractor includes a mechanical advantage mechanism for providing a mechanical advantage for securing a first multi stage mounting printed circuit board in place in a card guide. For example, printed circuit board extractor 200 grabs a lip on the card guide to provide force for inserting or extracting the multi stage printed circuit board into or out of the chassis. Printed circuit board extractor 200 also includes locking mechanism 230 for locking the first printed circuit board in place in the card guide.

In one embodiment of the present invention, a printed circuit board extractor includes a pivot point 240, a leverage arm 210, and a latch slot 220. Pivot point 240 permits the printed circuit board extractor to pivot about the pivot point and acts as a fulcrum. Leverage arm 210 drives the printed circuit board about the pivot point 240 when a force is applied to the leverage arm. Latch slot 220 is configured to grab a lip on the chassis which opposes the rotation of the printed circuit board extractor.

Referring still to FIG. 1A, it is appreciated that the printed circuit boards of multi stage printed circuit board mounting system 100 can include a variety of different components and the components can have a number of different configurations. For example, first multi stage mounting printed circuit board 120 can include processors, typically shown as processor 191, disposed on the top surface thereof. In one exemplary implementation, second printed circuit board 130 of multi stage printed circuit board mounting system 100 includes memory slots, typically shown as memory slot 180, disposed on the top surface of second printed circuit board 130. Components can also be mounted on both sides of a present invention multi stage printed circuit board.

Figure 1B:
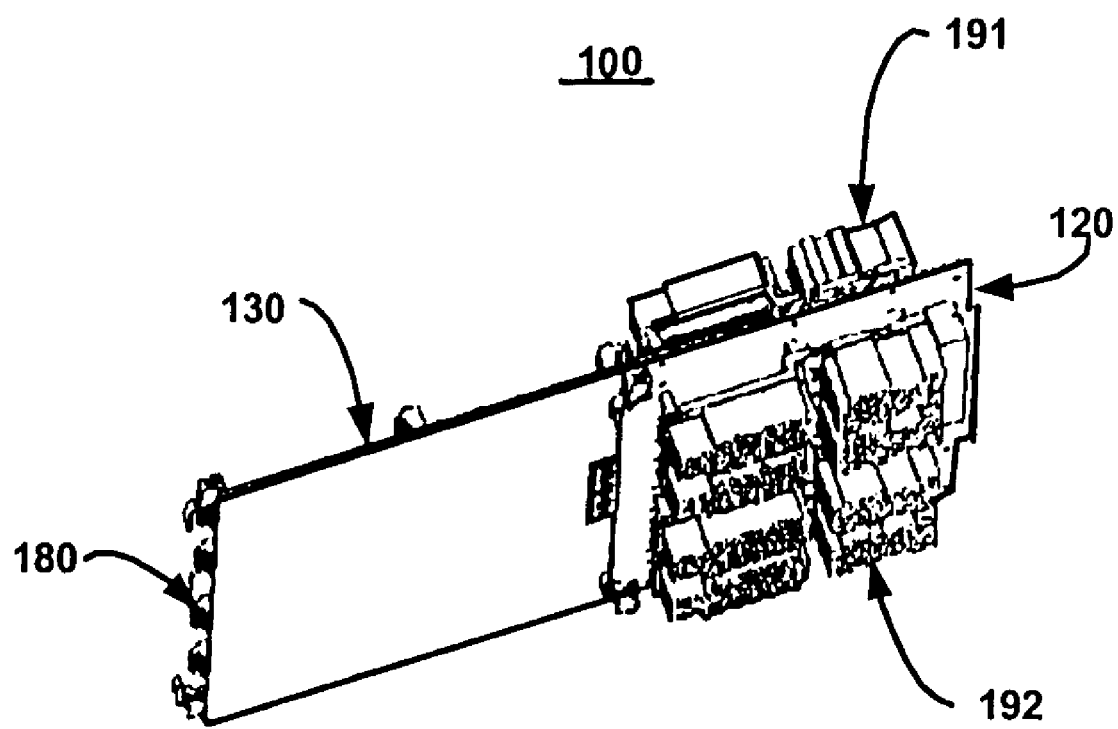
FIG. 1B is a bottom view diagram of a multi stage printed circuit board mounting system in accordance with one embodiment of the present invention.

FIG. 1B is an illustration of the bottom side of multi stage printed circuit board mounting system 100 in accordance with one embodiment of the present invention. Again FIG. 1B, illustrates that multi stage printed circuit board mounting system 100 comprises a plurality of multi stage mounting printed circuit boards coupled together. For example, first multi stage mounting printed circuit board or card 120 and second multi stage mounting printed circuit board or card 130 are coupled together. Multi stage mounting printed circuit board 120 also has processors, typically shown as 192, mounted on the bottom side in addition to processors, typically shown as 191, mounted on the top side. Although such components are used in the present embodiment of multi stage printed circuit board mounting system 100, the present invention is also well suited to having various other types and numbers of components arranged in various other configurations on the multi stage mounting printed circuit boards.

IN OPERATION

The following discussion sets forth in detail the operation of the present invention. As shown in FIG. 1A a first multi stage mounting printed circuit board 120 is communicatively coupled to back plane 110. Printed circuit board extractors included on first multi stage mounting printed circuit board 120 provide a mechanical advantage for inserting and/or extracting first multi stage mounting printed circuit board 120 from card guides 181 and 182 and coupling first multi stage mounting printed circuit board 120 to back plane 110. In one embodiment in which the printed circuit board extractors are a leverage arm type extractor (e.g., extractor 200), latch slots (e.g., latch slot 220) of the extractors grab the card guides (e.g., card guides 181 and 182). As force is exerted on a leverage arm (e.g., leverage arm 210) the printed extractor board extractor rotates about pivot point 240 causing the latch slots to provide a mechanical advantage in inserting and/or extracting the multi stage mounting printed circuit board. The resulting force drives the multi stage mounting printed circuit board down into or up out of the card guides depending upon the direction of the force applied to the leverage arm 210. When the multi stage mounting printed circuit board is inserted a locking mechanism (e.g., locking mechanism 230) prevents the latch slot from releasing against the card guides and holds the multi stage printed circuit boar in place.

With reference still to FIG. 1A, a second multi stage mounting printed circuit board (e.g., 130) is inserted in a pair of card guides (e.g., 182 and 182) and communicatively coupled to the first multi stage mounting printed circuit board (e.g., 120). In one embodiment of the present invention, the second multi stage mounting printed circuit board (e.g., 130) is inserted in the same pair of card guides (e.g., 182 and 182) as a first multi stage mounting printed circuit board and communicatively coupled to the first multi stage mounting printed circuit board (e.g., 120). Extractors (e.g., similar to extractor 200) included on the second multi stage printed circuit board (e.g., 130) similarly provide a mechanical advantage for inserting and/or extracting second multi stage printed circuit board 130 from card guides 181 and 182 and communicatively coupling the first (e.g., 120) and second multi stage mounting printed circuit boards (130). In an embodiment with a leverage arm type extractor, latch slots of the extractors grabs the card guides and as force is exerted on leverage arm the extractor rotates about pivot point 240 causing the length of the leverage arm to provide a mechanical advantage in coupling the second multi stage mounting printed circuit board to the first multi stage mounting printed circuit board. The mechanical advantage helps overcome the resistance of the interconnection components on both the multi stage printed circuit boards.

The locking mechanism of the extractors also provides advantageous modularity facilitating features. When the multi stage mounting printed circuit board is inserted a locking mechanism prevents the latch slot from releasing against the card guides and holds the multi stage printed circuit board in place. The force exerted by the extractor on the card guides with the locking mechanism engaged on a first multi stage mounting printed circuit board holds the first multi stage mounting printed circuit board in place when a second multi stage mounting printed circuit board is removed. Permitting a second printed circuit board to be removed while the first printed circuit board remains enables flexibility in design configurations be enabling printed circuit boards with different components and/or functionality to be coupled to the first printed circuit board. The present invention also facilitates servicing in the field by enabling the second circuit board to be conveniently replaced without having to replace the first circuit board.

In one embodiment of the present invention, a plurality of printed circuit boards are mounted in a pair of card guides in a cascaded sequential fashion. One of the plurality of printed circuit boards is removable separate from another one of the plurality of printed circuit boards. In one exemplary implementation a coordination mechanism permits the plurality of printed circuit boards to be inserted and removed from the card guide in unison. For example, locking mechanism of each individual extractor are released and a coupling locking mechanism between the multi stage mounting printed circuit boards is engaged.

In one embodiment, the back planes are included in a chassis or card cage. The chassis includes a chassis rail or card guide. The chassis or card cage can be implemented in an equipment rack.

FIG. 3 is a flow chart of multi stage printed circuit board mounting method 300 in accordance with one embodiment of the present invention. Multi stage printed circuit board mounting method 300 facilitates flexible and modular configuration of printed circuit boards in a chassis. Multi stage printed circuit board mounting method 300 enables multiple printed circuit boards to be mounted (e.g., inserted and extracted) in a single pair of card guides. The printed circuit boards can be inserted and extracted separately in a secure and convenient manner.

In step 310, movement of a plurality of printed circuit boards is restricted within card guides. In one embodiment, the plurality of printed circuit boards is restricted within single pair of card guides. In one exemplary implementation, side walls on the card guides permit multi stage mounting printed circuit boards to move in an insertion and extraction direction while preventing movement in other directions. The printed circuit boards can be mounted in a sequential cascaded manner within the single pair of the card guides. Each of the plurality of printed circuit boards are communicatively coupled to one another.

As indicated in FIG. 3, forces associated with a mechanical advantage are exerted in step 320 and contribute to insertion and extraction of each of the plurality of printed circuit boards separately in card guides (e.g., a single pair of card guides or a plurality of card guide pairs). In one embodiment a leverage arm extractor (e.g., extractor 200) is utilized to provide the mechanical advantage. In one exemplary implementation, a force is asserted on a leverage arm of an extractor which causes the extractor to pivot about a pivot or fulcrum point. The rotation causes a latch to exert force on a chassis lip which in turn resists the force and drives the multi stage mounting printed circuit board coupled to the extractor into or out of a card guide and also couples or decouples a pair of multi stage mounting printed circuit board interconnection components.

In step 330, each of the plurality of printed circuit boards are locked in place individually in the single pair of the card guides. In one embodiment one of the plurality of printed circuit boards is locked in place while another of the plurality of printed circuit boards is extracted. Permitting printed circuit boards to be removed while other printed circuit boards remain in place enables flexibility in design configurations. The present invention also facilitates servicing in the field by enabling some of the circuit boards to be conveniently replaced without having to replace the other printed circuit boards.

Thus, the present invention facilitates modular mounting of a plurality of multi stage mounting printed circuit boards in card guides. A present invention multi stage mounting printed circuit board configuration also facilitates conservation of precious back plane space by enabling one back plane space to be utilized for the plurality of multi stage mounting printed circuit boards. The printed circuit boards can plug into one another in a cascaded sequential manner (e.g., in a single pair of card guides or a plurality of card guides) and can be extracted or inserted separately. The invention allows an otherwise potentially large and complex printed circuit board to be broken up into smaller pieces to aid servicing and reliability. Present invention multi stage mounting printed circuit boards also include extractors that provide mechanical advantage for assisting with coupling/decoupling of the multi stage mounting printed circuit boards to and from one another as well as insertion and/or removal of the multi stage mounting printed circuit boards to or from card guides. The mechanical advantage mechanisms also include features for securing the printed circuit boards in place. The present invention also enables shorter electrical bus lengths between two printed circuit boards coupled directly to each other as compared with two printed circuit boards coupled via a backplane.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various modifications as are suited to the particular use contemplated. It is intended that the scope of the invention be defined by the claims appended hereto and their equivalents.

What is claimed is:

1. A multi stage mounting printed circuit board comprising:
    a first printed circuit board having a first functionality, said first printed circuit board coupled to a pair of card guides;
    a second printed circuit board having a second functionality, said second printed circuit board coupled to said pair of card guides;
    a printed circuit board interface for coupling said second printed circuit board with said first printed circuit board in a modular configuration to provide a functional multi-stage printed circuit board, wherein said modular configuration enables replacement of either said first printed circuit board or said second printed circuit board from said pair of card guides without requiring the removal of the other of said first printed circuit board or said second printed circuit board from said pair of card guides; and
    a plurality of printed circuit board extractors coupled to said first printed circuit board and said second printed circuit board, said plurality of printed circuit board extractors for coupling said first printed circuit board and said second printed circuit board to said pair of card guides.

2. The multi stage mounting printed circuit board of claim 1 wherein said plurality of printed circuit board extractors include a mechanical advantage mechanism for providing a mechanical advantage for securing said first printed circuit board in place in said card guides.

3. The multi stage mounting printed circuit board of claim 1 wherein said plurality of printed circuit board extractors include a locking mechanism for locking said first printed circuit board in place in said card guides.

4. The multi stage mounting printed circuit board of claim 1 wherein one of said plurality of printed circuit board extractors include:
    a pivot point for permitting said one of said plurality of printed circuit board extractors to pivot;
    a leverage arm leverage arm for driving said printed circuit board about said pivot point; and
    a latch slot for grabbing a lip on said one of said card guides.

5. The multi stage mounting printed circuit board of claim 1 wherein said first printed circuit board interface component includes a signal port for communicating signals from said first printed circuit board to said second printed circuit board.

6. A multi stage printed circuit board mounting system comprising:
    a plurality of multi stage printed circuit boards configured in a cascaded fashion wherein each of said plurality of multi stage printed circuit boards comprise a different functionality;
    a plurality of printed circuit board interfaces for coupling said plurality of multi stage printed circuit boards in a modular configuration to provide a functional multi-stage printed circuit board;
    a back plane for receiving one of said plurality of printed circuit boards; and
    a pair of card guides for coupling said plurality of printed circuit boards in a modular configuration such that a removal of one of said plurality of printed circuit boards from said pair of card guides does not require the removal of any of the remaining of said plurality of printed circuit boards from said pair of card guides.

7. The multi stage printed circuit board mounting system of claim 6 wherein said plurality of multi stage mounting printed circuit boards are mounted in said plurality of card guides in a cascaded fashion.

8. The multi stage printed circuit board mounting system of claim 6 wherein one of said plurality of multi stage mounting printed circuit boards is removable separate from another one of said plurality of multi stage mounting printed circuit boards.

9. The multi stage printed circuit board mounting system of claim 6 further comprising a coordination mechanism for permitting said plurality of multi stage mounting printed circuit boards to be inserted and removed from said plurality of card guides in unison.

10. A multi stage printed circuit board mounting system of claim 3 wherein each one of said plurality of multi stage mounting printed circuit boards includes:
    a first printed circuit board interface component coupled to a first one of said plurality of multi stage mounting printed circuit boards; said first printed circuit board interface component for communicatively coupling said first one of said plurality of multi stage mounting printed circuit boards to a second one of said plurality of multi stage mounting printed circuit boards; and
    a plurality of printed circuit board extractors coupled to said first one of said plurality of multi stage printed circuit boards, said plurality of printed circuit board extractors for coupling said first one of said plurality of multi stage printed circuit boards to a single pair of card guides in which a second one of said plurality of multi stage printed circuit boards is mounted.

11. The printed circuit board mounting system 10 wherein said plurality of multi stage mounting printed circuit board extractors include a mechanical advantage mechanism for providing a mechanical advantage for securing said each respective one of said plurality of multi stage mounting printed circuit boards in place in said card guides.

12. The printed circuit board mounting system of claim 10 wherein said leverage mechanism grabs a lip on said chassis to provide force for inserting or extracting said each respective one of said plurality of multi stage mounting printed circuit boards into or out of said chassis.

13. The printed circuit board mounting system claim 10 wherein said plurality of multi stage mounting printed circuit board extractors include a locking mechanism for locking said each respective one of said plurality of printed circuit boards in place in said card guides.

14. The printed circuit board mounting system of claim 10 wherein each one of said plurality of printed circuit board extractors includes:

a pivot point for permitting said extractor to pivot:

a leverage arm leverage arm for driving said each one of said plurality of printed circuit board extractors about said pivot point;

a latch slot for grabbing a lip on said chassis.

15. The printed circuit board mounting system of claim 10 wherein each one of said plurality of printed circuit boards can be inserted or extracted individually in a sequential fashion.

* * * * *

UNITED STATES PATENT AND TRADEMARK OFFICE
CERTIFICATE OF CORRECTION

| | | |
|---|---|---|
| PATENT NO. | : 7,280,371 B2 | Page 1 of 1 |
| APPLICATION NO. | : 10/758982 | |
| DATED | : October 9, 2007 | |
| INVENTOR(S) | : Stephan Karl Barsun et al. | |

It is certified that error appears in the above-identified patent and that said Letters Patent is hereby corrected as shown below:

On the title page, in item (54), in "Title", line 1, delete "MULTISTAGE" and insert
-- MULTI STAGE --, therefor.

In column 1, in "Title", line 1, delete "MULTISTAGE" and insert -- MULTI STAGE --, therefor.

In column 8, line 13, in Claim 4, after "a leverage arm" delete "leverage arm".

In column 8, line 55, in Claim 10, delete "claim 3" and insert -- claim 6 --, therefor.

In column 9, line 4, in Claim 11, after "mounting system" insert -- of claim --.

In column 9, line 15, in Claim 13, after "mounting system" insert -- of --.

In column 10, line 7, in Claim 14, after "a leverage arm" delete "leverage arm".

Signed and Sealed this

Eighteenth Day of May, 2010

David J. Kappos
*Director of the United States Patent and Trademark Office*